(12) United States Patent
Liu et al.

(10) Patent No.: US 11,708,495 B2
(45) Date of Patent: Jul. 25, 2023

(54) PRIMING MATERIAL FOR SUBSTRATE COATING

(71) Applicant: Taiwan Semiconductor Manufacturing Company, Ltd., Hsin-Chu (TW)

(72) Inventors: Chen-Yu Liu, Kaohsiung (TW); Ching-Yu Chang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 242 days.

(21) Appl. No.: 16/579,187

(22) Filed: Sep. 23, 2019

(65) Prior Publication Data

US 2020/0017693 A1 Jan. 16, 2020

Related U.S. Application Data

(63) Continuation of application No. 14/791,877, filed on Jul. 6, 2015, now Pat. No. 10,421,867.
(Continued)

(51) Int. Cl.
*C09D 5/00* (2006.01)
*H01L 21/027* (2006.01)
(Continued)

(52) U.S. Cl.
CPC ............. *C09D 5/002* (2013.01); *G03F 7/162* (2013.01); *G03F 7/168* (2013.01);
(Continued)

(58) Field of Classification Search
CPC .......... B05D 1/005; B05D 3/104; B05D 7/52; C09D 5/002; G03F 7/162; G03F 7/168;
(Continued)

(56) References Cited

U.S. PATENT DOCUMENTS 4,264,715 A * 4/1981 Miura ..................... G03F 7/325
427/271
5,858,475 A 1/1999 Chiu
(Continued)

FOREIGN PATENT DOCUMENTS

CN 1180447 4/1998
CN 102289151 A 12/2011
(Continued)

*Primary Examiner* — James M Mellott
(74) *Attorney, Agent, or Firm* — Haynes and Boone, LLP

(57) ABSTRACT

A coating technique and a priming material are provided. In an exemplary embodiment, the coating technique includes receiving a substrate and identifying a material of the substrate upon which a layer is to be formed. A priming material is dispensed on the material of the substrate, and a film-forming material is applied to the priming material. The priming material includes a molecule containing a first group based on an attribute of the substrate material and a second group based on an attribute of the film-forming material. Suitable attributes of the substrate material and the film-forming material include water affinity and degree of polarity and the first and second groups may be selected to have a water affinity or degree of polarity that corresponds to that of the substrate material and the film-forming material, respectively.

20 Claims, 6 Drawing Sheets

Related U.S. Application Data

(60) Provisional application No. 62/133,755, filed on Mar. 16, 2015.

(51) Int. Cl.

| | | |
|---|---|---|
| *H01L 21/67* | (2006.01) | |
| *G03F 7/16* | (2006.01) | |
| *H01L 21/02* | (2006.01) | |
| *B05D 3/10* | (2006.01) | |
| *B05D 7/00* | (2006.01) | |
| *B05D 1/00* | (2006.01) | |

(52) U.S. Cl.
CPC ...... *H01L 21/0271* (2013.01); *H01L 21/6715* (2013.01); *B05D 1/005* (2013.01); *B05D 3/104* (2013.01); *B05D 7/52* (2013.01); *H01L 21/02118* (2013.01); *H01L 21/02282* (2013.01)

(58) Field of Classification Search
CPC ......... H01L 21/02118; H01L 21/02282; H01L 21/0271; H01L 21/6715
See application file for complete search history.

(56) References Cited

U.S. PATENT DOCUMENTS

| | | | |
|---|---|---|---|
| 5,972,428 A | 10/1999 | Hayashi et al. | |
| 6,121,218 A | 9/2000 | Thompson | |
| 6,159,549 A | 12/2000 | Sundararaman et al. | |
| 6,361,921 B1 | 3/2002 | Thompson | |
| 6,461,983 B1 * | 10/2002 | Davlin .................. | B05D 1/005 438/782 |
| 6,736,896 B2 | 5/2004 | Lin | |
| 6,814,825 B2 * | 11/2004 | Becker ................ | B32B 37/1054 156/64 |
| 7,705,115 B2 | 4/2010 | Itou et al. | |
| 8,062,705 B2 | 11/2011 | Ou-Yang | |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2002/0127878 A1 | 9/2002 | Young et al. | |
| 2003/0101928 A1 | 6/2003 | Chuang et al. | |
| 2004/0156983 A1 | 8/2004 | Moravec et al. | |
| 2004/0206702 A1 * | 10/2004 | Davidson ........... | B01D 11/0492 210/634 |
| 2004/0216664 A1 * | 11/2004 | Daggett ............ | H01L 21/67253 118/52 |
| 2009/0291198 A1 * | 11/2009 | Yoshihara ........... | H01L 21/6715 427/299 |
| 2011/0312190 A1 * | 12/2011 | Ichino ............... | H01L 21/67178 438/782 |
| 2013/0026624 A1 * | 1/2013 | Erwin ..................... | H01L 24/05 257/E21.585 |
| 2013/0189852 A1 | 7/2013 | Yoshihara et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272704 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2016/0276151 A1 | 9/2016 | Liu et al. | |

FOREIGN PATENT DOCUMENTS

| | | |
|---|---|---|
| JP | S611331529 A | 6/1986 |
| JP | H05317797 A | 12/1993 |
| JP | H09270373 A | 10/1997 |
| JP | 2003022966 A | 1/2003 |

* cited by examiner

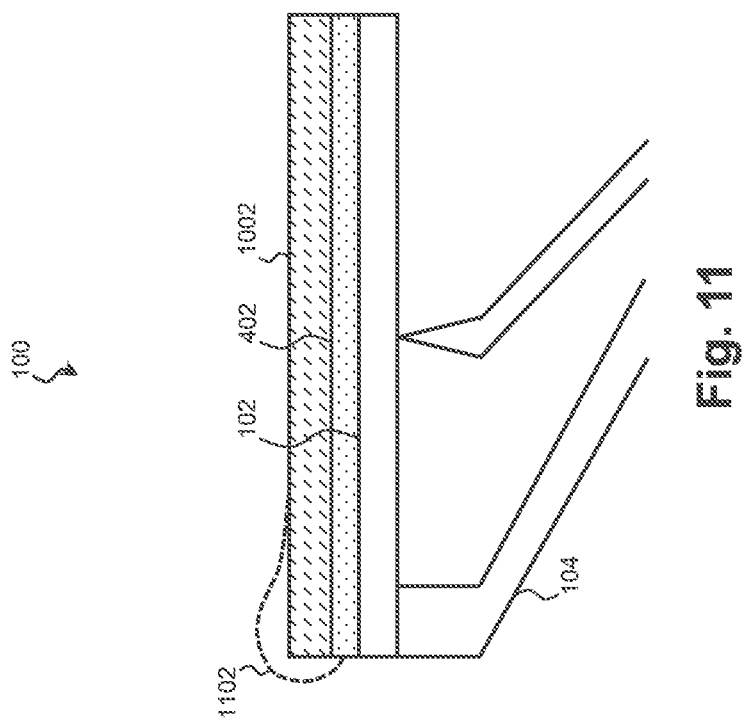

PRIMING MATERIAL FOR SUBSTRATE COATING

PRIORITY DATA

The present application is a continuation application of U.S. Ser. No. 14/791,877, filed Jul. 6, 2015, which claims priority to U.S. Provisional Patent Application Ser. No. 62/133,755 entitled "Priming Material for Spin Coating," and filed Mar. 16, 2015, each of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, many fabrication steps involve the formation and manipulation of thin films of material formed on a substrate or wafer. Defects, imperfections, irregularities, and contaminants in these film layers may undermine the fabrication process and may precipitously affect both yield and device performance. As films are layered upon each other, the effects of even small imperfections in underlying layers may become magnified. Thus, the importance of uniformity and precise application cannot be overemphasized.

Spin coating is one technique for forming a thin layer of material on a substrate that has proved satisfactory in some applications. Spin coating may involve depositing a material in liquid form at the center of a substrate and spinning the substrate to drive the liquid to the edges. In this way, spin coating leverages the centrifugal tendencies of the liquid to produce a film of significantly uniform thickness.

However, while existing spin coating techniques have been generally adequate, the potential for future improvements still exists. For example, uniformity of the final film may still be improved. As another example, because many advanced fabrication processes rely on increasingly expensive materials, improved coverage using less liquid may meaningfully reduce cost per device. For these reasons and others, additional improvements to spin coating techniques hold the potential to improve fabrication yield and to reduce cost and waste.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8-11 are further side views of the spin coating system performing the method to apply a film to the substrate according to various aspects of the present disclosure.

DETAILED DESCRIPTION

Figure 2:
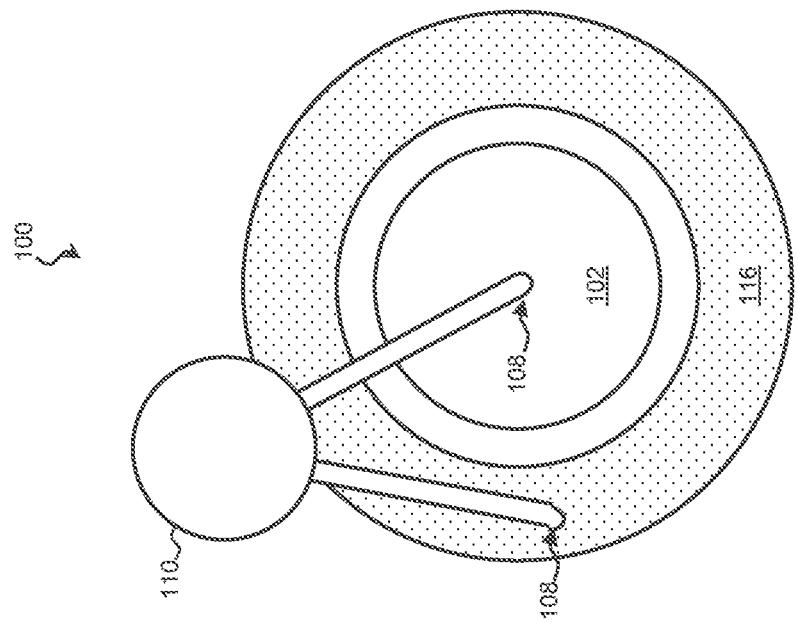
FIG. 2 is a top view of the spin coating system according to various aspects of the present disclosure.

The present disclosure relates generally to IC device manufacturing and, more particularly, to an improved technique for spin coating that utilizes improved priming materials.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
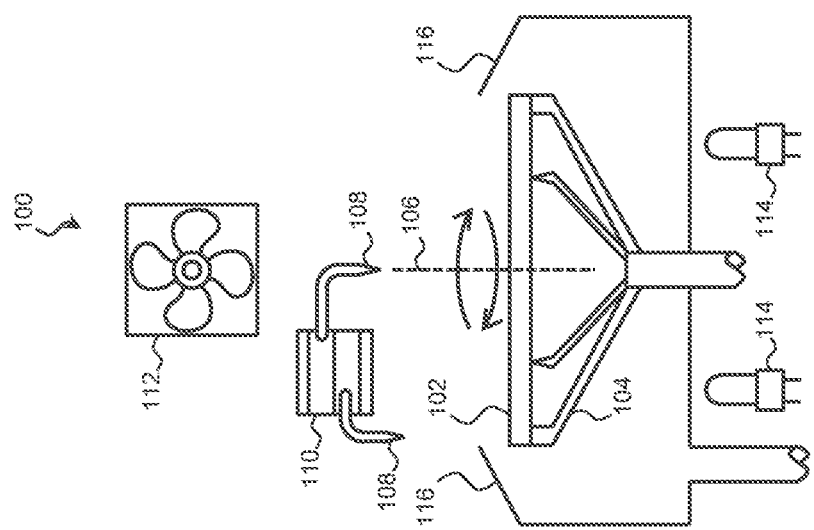
FIG. 1 is a side view of a spin coating system according to various aspects of the present disclosure.

The present disclosure relates to the application of a material to a work piece, such as a semiconductor substrate, using spin coating or similar techniques. An example of a spin coating system 100 suitable for performing this technique is described with reference to FIGS. 1 and 2. In that regard, FIG. 1 is a side view of a spin coating system 100 according to various aspects of the present disclosure, and FIG. 2 is a top view of the spin coating system 100 according to various aspects of the present disclosure. For clarity and ease of explanation, some elements of the figures have been simplified.

The spin coating system 100 utilizes the rotation of a substrate 102 to distribute a liquid across the surface. Accordingly, the system 100 may include a rotating chuck 104 operable to retain and rotate the substrate 102. The chuck 104 may use any method to retain the substrate 102, and in some exemplary embodiments, the chuck 104 is a vacuum chuck 104. Accordingly, in the illustrated embodiment, a central cavity within the chuck 104 is connected to a vacuum pump. The chuck 104 is sealed against a back surface of the substrate 102, and air within the cavity is evacuated to hold the substrate 102 in place.

Once the substrate 102 is secured, the chuck 104 rotates around a central axis 106 causing the retained substrate 102 to rotate as well. Rotational speeds may reach or exceed 3,000 rpm based on the application. Because of increased turbulence and rotational instability, maximum rotational speeds for larger wafers tend to be slower, and a typical maximum rotational speed for a 300 mm substrate 102 may be between about 800 rpm and about 4,000 rpm. The rotational speed of the chuck 104 (and by extension the substrate 102) may vary throughout the spin coating technique in order to control the dispersal of the liquid being applied.

To supply the liquid, spin coating system 100 may include one or more nozzles 108 and associated supply lines mounted on a movable armature 110. The movable armature 110 may relocate the nozzles to a "home" position out of the loading path when a new substrate 102 is being secured and moves the nozzles into position over a central portion of the substrate 102 once the substrate 102 has been loaded. In some embodiments, the moveable armature 110 also allows the nozzles 108 to be positioned anywhere along the radius of the substrate 102 during the spin coating process. In addition to liquid supply nozzles 108, the system 100 may include one or more gas delivery nozzles 108 on the armature 110 and aimed to direct air towards the substrate surface being coated. The gas delivery nozzles 108 may blow ambient air or one or more gasses such as nitrogen, argon, and/or helium on the substrate surface. While the gas is being supplied, the movable armature 110 may sweep the nozzles 108 across the surface of a spinning substrate 102 in order to drive the liquid outward. The air provided by the gas delivery nozzles 108 may be heated in order to control viscosity, thickness, evaporation, and/or solidification of the liquids provided on the substrate 102. For example, in some embodiments, air supplied by the gas delivery nozzles 108 is maintained at about 23° C. in order to keep the liquid viscous without over drying.

In addition to a gas delivery nozzle 108 or as an alternative thereto, the spin coating system 100 may include a downdraft air flow device 112 that directs air towards the surface of the substrate 102 upon which the film is being formed. Similar to the gas delivery nozzles 108, the air flow device 112 may blow ambient air or one or more gasses such as nitrogen, argon, and/or helium at the substrate surface. The air provided by the air flow device 112 may be heated in order to control viscosity, thickness, evaporation, and/or solidification of the liquids provided on the substrate. In that regard, some degree of evaporation during the application process may be desirable in order to produce thicker films, while over drying may prevent the liquid from fully covering the substrate 102 before solidifying.

To further control evaporation, the spin coating system 100 may include one or more heating elements 114 controlled to maintain the substrate 102 and any liquids disposed thereupon at a designated temperature. In some examples, the heating elements 114 are controlled according to a complex thermal profile that varies the substrate 102 temperature throughout the spin coating process. As with the gas delivery nozzle 108 and air flow device 112, the heating elements 114 may be used to control ambient temperature and thereby control viscosity, thickness, evaporation, and/or solidification of the liquids provided on the substrate 102.

As the substrate 102 rotates, some liquid deposited on the substrate may be ejected from the substrate 102. Much of the ejected liquid will come from the circumferential edge of the substrate 102, although some liquid will be ejected elsewhere along the surface of the substrate 102. To catch this liquid, the spin coating system 100 may include a coater cup 116 or dish surrounding the chuck 104 and the retained substrate 102. The cup 116 is shaped to catch the liquid and to prevent the ejected liquid from dripping or otherwise re-depositing on the substrate 102. Back-splattered liquids that re-deposit on a substrate 102 have been determined to cause spotting and other imperfections that may adversely impact yield. Depending on the degree of contamination, some of the captured liquid may be recycled and reused, although the liquid may also be captured for disposal. Disposal is an important consideration because many of the liquids used in spin coating have significant disposal costs. In one example, disposal costs were determined to be approximately 30% of the material costs associated with applying a particular photoresist film. In many applications, reducing the amount of liquid used to coat the substrate 102 also reduces the amount of excess material to be disposed of.

Figure 3:
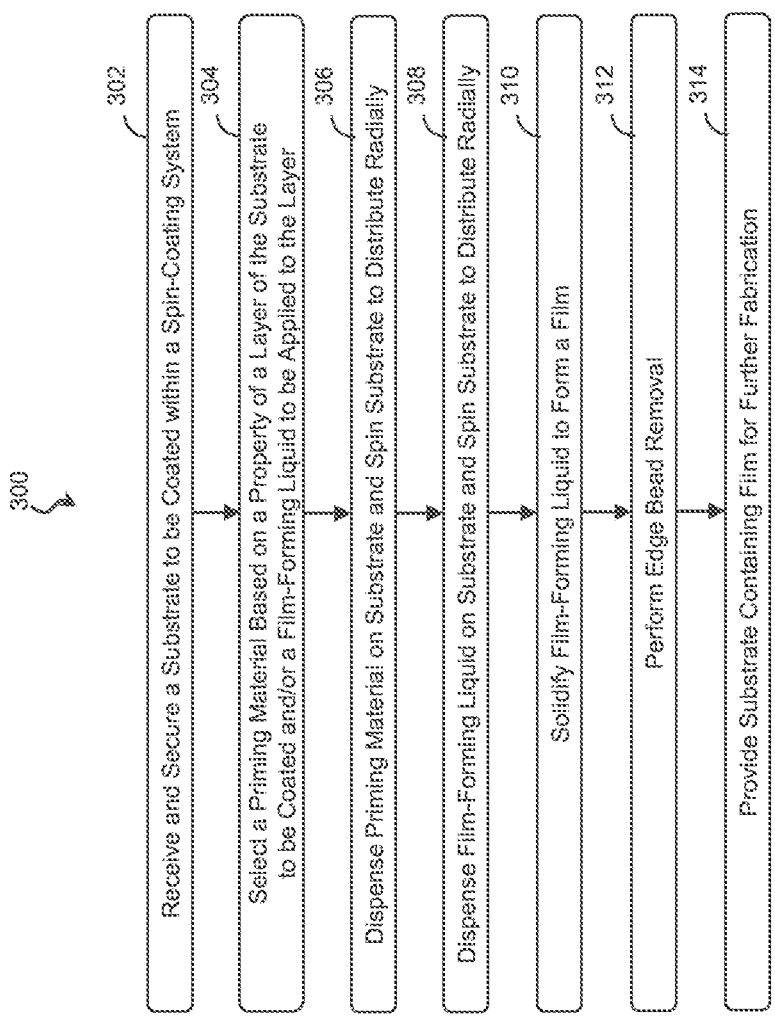
FIG. 3 is a flow diagram of a method for applying a film to a substrate according to various aspects of the present disclosure.
Figure 5:
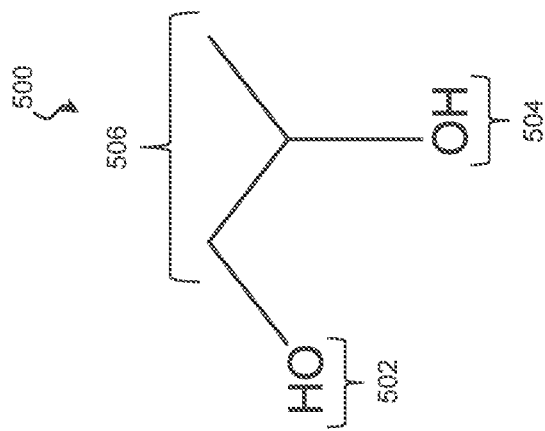
FIGS. 5-7 are molecular diagrams of chemical compounds suitable for use as a priming material in the method of applying a film according to various aspects of the present disclosure.
Figure 6:
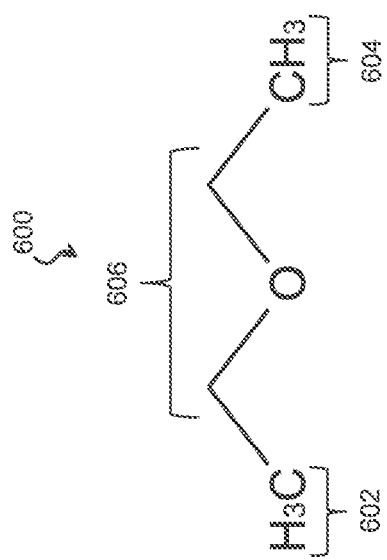
Figure 7:
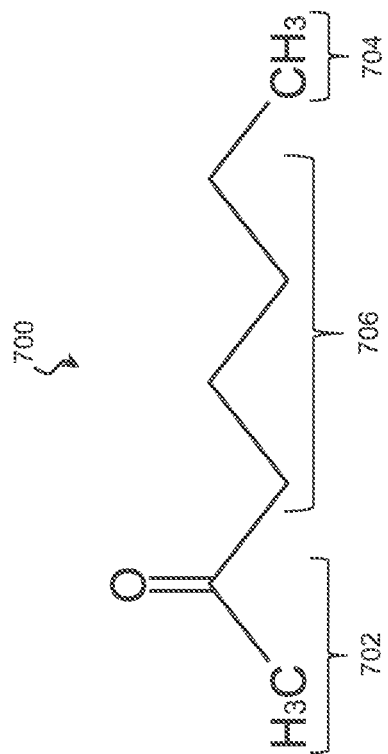

A technique for utilizing the spin coating system 100 that offers improved coverage with a reduced volume of liquid is described with reference to FIGS. 3-11. The technique is suitable for use in forming any of a wide variety of films upon a substrate 102, with exemplary films including photoresist films, multi-layer photoresist (e.g., trilayer resist) films, antireflective coating films (e.g., a bottom antireflective coating (BARC) film), hard mask films, and/or other suitable films. As explained in more detail below, a priming material is first applied to the substrate to facilitate the subsequent application of a film-forming liquid by improving the flow and coverage of the film-forming liquid. In order to further improve the coverage of both the priming material and the film-forming liquid, the priming material may be tuned based on the film-forming liquid and the layer of the substrate 102 being covered. FIG. 3 is a flow diagram of a method 300 for applying a film to a substrate 102 according to various aspects of the present disclosure. It is understood that additional steps can be provided before, during, and after the method 300 and that some of the steps described can be replaced or eliminated for other embodiments of the method 300. FIGS. 4 and 8-11 are side views of a spin coating system 100 performing the method 300 to apply a film to the substrate 102 according to various aspects of the present disclosure. The spin coating system 100 may be substantially similar to that of FIG. 1 and may include a substrate 102, chuck 104, nozzles 108, an air flow device 112, a heating element 114 and/or other elements substantially as described above. FIGS. 5-7 are molecular diagrams of chemical compounds suitable for use as a priming material in the method of applying a film according to various aspects of the present disclosure. For clarity and ease of explanation, some elements of the figures have been simplified and some elements of the figures have been exaggerated.

Figure 4:
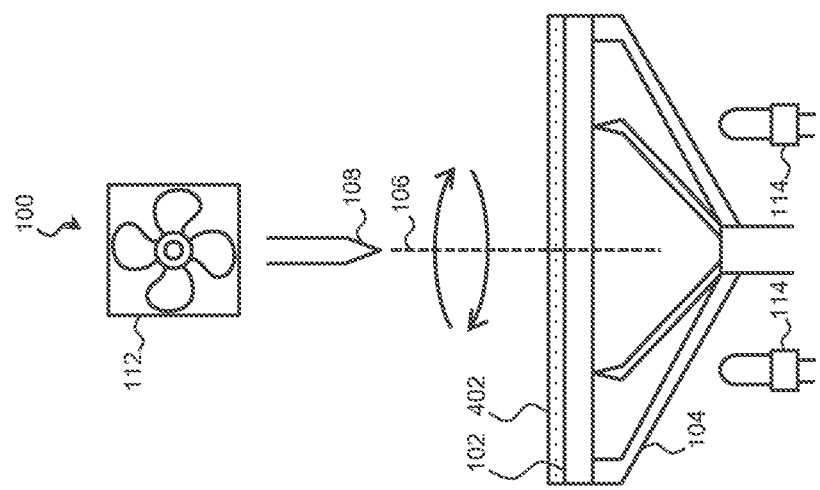
FIG. 4 is a side view of a spin coating system performing the method to apply a film to the substrate according to various aspects of the present disclosure.

Referring to block 302 of FIG. 3 and to FIG. 4, a substrate 102 is received and secured within a chuck 104 of the spin coating system 100. The substrate 102 is exemplary of any material upon which upon which other materials may be formed and may represent a semiconductor substrate for circuit fabrication, a mask substrate, and/or any other suitable substrate for any other suitable application. In various examples, the substrate 102 comprises an elementary (single element) semiconductor, such as germanium in a crystalline structure; a compound semiconductor, such as silicon germanium, silicon carbide, gallium arsenic, gallium phosphide, indium phosphide, indium arsenide, and/or indium antimonide; a non-semiconductor material, such as sodalime glass, fused silica, fused quartz, and/or calcium fluoride ($CaF_2$); and/or combinations thereof. The substrate 102 may also include various material layers formed upon it. For example, exemplary layer 402 of the substrate 102 may represent a semiconductor layer, a dielectric layer, a conductive layer, a polymer layer, and/or other material layers.

In some such embodiments, layer 402 represents a layer of a trilayer resist. An exemplary trilayer resist includes an under layer designed to provide protection for underlying materials. The under layer may function as a mask to protect the underlying materials (e.g., substrate 102) from etching, ion implantation, or other processing. In some embodiments, the under layer includes an organic polymer. The underlay material may be free of silicon in order to provide etchant selectivity with respect to a middle layer of the resist. In that regard, the trilayer resist may include a middle layer that includes the organic polymer with the addition of silicon and/or another silicon-containing material such that the middle layer is sensitive to a different set of etchants than the under layer. The middle layer may function as an etch mask to transfer a pattern to the under layer. In some embodiments, the middle layer may further function as a bottom anti-reflective coating that reduces reflection during a lithography exposure process, thereby increasing the imaging contrast and enhancing the imaging resolution. The trilayer resist may also include a photoresist layer formed on top of the middle layer. The photoresist layer may include a photosensitive chemical and a polymeric material. In some embodiments, the photosensitive layer utilizes a chemical amplification (CA) resist material. For example, a positive CA resist material includes a polymer material that turns soluble to a developer such as a base solution after the polymeric material is exposed and reacted with acid. Alternatively, the CA resist material can be negative and include a polymer material that turns insoluble to a developer such as a base solution after the polymer is exposed and reacted with acid. The photoresist layer may also include one or more of a solvent, a photo-acid generator (PAG), and/or a quencher. Of course, it is understood that a trilayer resist is only one of a wide range of exemplary materials represented by layer 402.

Before a film-forming material is dispensed on a layer 402, a priming material may be applied to the layer 402. It has been determined through investigation and experimentation that some difficulties inducing the film-forming liquid to cover the layer 402 arise from chemical properties of the layer 402 being coated. Specifically, it has been determined that these properties cause the priming material, the film-forming liquid, or both to resist dispersing uniformly. However, it has also been determined that by selecting or otherwise configuring a priming material based on, in part, attributes of the substrate 102 and specifically the material layer 402 being coated, coverage can be improved far more than expected. As a result, the occurrence of dry spots, ridges, irregularities, and other imperfections may be dramatically reduced.

Accordingly, referring to block 304 of FIG. 3, a priming material is selected. The selected priming material is applied to the substrate 102 before the film-forming liquid and may be selected to facilitate the flow of the film-forming liquid during the spin coating process. In that regard, the priming material may be selected and/or otherwise configured based on, in part, attributes of the material layer 402 being coated and/or attributes of the film forming liquid being applied to the priming material.

One aspect of the material layer 402 that may be considered is the water affinity (e.g., hydrophobic or hydrophilic nature) of the material layer 402. Thus, the priming material may be selected to have a similar water affinity to the material layer 402. In other words, a hydrophobic priming material may be selected for coating a hydrophobic material layer 402 and vice-versa. The degree to which the material layer 402 is hydrophobic or hydrophilic may also be considered. For example, a strongly hydrophobic priming material may be selected for application on a strongly hydrophobic material layer 402. Additionally, or in the alternative, the water affinity of the film-forming liquid may also be considered, and the priming material may be selected to have a similar water affinity to the film-forming liquid. In that way, a hydrophobic priming material may be selected for use with a hydrophobic film-forming liquid and vice-versa. The degree to which the film-forming liquid is hydrophobic or hydrophilic may also be considered. In examples in which the material layer 402 and the film-forming liquid differ in water affinity or degree of affinity, the priming material may be configured to have a first portion tuned to the water affinity of the material layer 402 and a second portion tuned to the water affinity of the film-forming liquid.

Another aspect of the material layer 402 and/or film-forming liquid that may be considered is the polarity (e.g., polar or non-polar nature). The polarity as well as the degree to which a compound is polar or non-polar may both be considered. Accordingly, the priming material may be selected to have a similar polarity to the material layer 402 and/or the film-forming liquid. In that regard, a polar priming material may be selected for application on a polar material layer 402 and vice-versa, and a polar priming material may be selected for use with a polar film-forming liquid and vice versa. In examples in which the material layer 402 and the film-forming liquid differ polarity or degree of polarity, the priming material may be configured to have a first portion tuned to the polarity of the material layer 402 and a second portion tuned to the polarity of the film-forming liquid.

Examples of suitable priming materials are described with reference to FIGS. 5-7. Referring first to FIG. 5, a chemical structure of a priming material molecule 500 is shown. Specifically, the illustrated molecule is propylene glycol, and it represents a class of priming materials with two sets of adhesion groups, both of which have similar properties. The priming material molecule has a first adhesion group 502, which may be tuned to one of the material layer 402 or the film-forming liquid, and a second adhesion group 504, which may be tuned to the other of the material layer 402 or the film-forming liquid. In the example of propylene glycol and other suitable priming materials of this class, both adhesion groups 502 and 504 are polar and hydrophilic, making this class of priming material well-suited for use in applications where both the material layer 402 and the film-forming liquid are polar and/or hydrophilic. Suitable chemical structures for adhesion groups 502 and 504 include hydroxyl groups, amine groups, amide groups, thiol groups, esters, carboxylic acid, anhydride groups, silane, epoxy groups, ketones, cyano groups, isocyano groups, imide groups, and/or other suitable groups. Another exemplary priming material in this class is diethylene glycol.

The adhesion groups 502 and 504 may be joined by a linking chain 506 of any suitable molecular length and composition such as a substituted or unsubstituted alkyl, a substituted or unsubstituted aryl, a substituted or unsubstituted heteroaryl, a substituted or unsubstituted heterocycloalkyl, and/or other suitable chain. The number of atoms in the linking chain 506 may affect the evaporation rate of the priming material. Many of the parameters used to apply the priming material (e.g., temperature, spin speed, spin time, etc.) depend on the evaporation rate, and accordingly, the composition of the linking chain 506 may be selected to control the dispersal, thickness, and longevity of the priming material during the spin coating process.

Referring to FIG. 6, a chemical structure of a priming material molecule 600, specifically diethyl ether, is shown and represents a class of priming materials with two sets of adhesion groups, both of which have similar properties. The priming material molecule has a first adhesion group 602, which may be tuned to one of the material layer 402 or the film-forming liquid, and a second adhesion group 604, which may be tuned to the other of the material layer 402 or the film-forming liquid. In contrast to the examples of FIG. 5, diethyl ether and other suitable priming materials in this class include adhesion groups 602 and 604 that are non-polar and/or hydrophobic, making this class of priming material well-suited for use in applications where both the material layer 402 and the film-forming liquid are non-polar and/or hydrophobic. Suitable chemical structures for adhesion groups 602 and 604 include alkyl groups, phenyl groups, biphenyl groups, benzyl groups, ether groups, cycloalkyl groups, aromatic rings, and/or other suitable groups.

As in the previous examples, the adhesion groups 602 and 604 may be joined by a linking chain 606 of any suitable molecular length and composition such as a substituted or unsubstituted alkyl, a substituted or unsubstituted aryl, a substituted or unsubstituted heteroaryl, a substituted or unsubstituted heterocycloalkyl, and/or other suitable chain. The number of atoms in the linking chain 606 may be selected to control the dispersal, thickness, and longevity of the priming material during the spin coating process.

Referring to FIG. 7, a chemical structure of a priming material molecule 700, specifically 2-heptanone, is shown and represents priming materials with two sets of adhesion groups that have different properties. The priming material molecule has a first adhesion group 702 that may be tuned to one of the material layer 402 or the film-forming liquid and is polar and/or hydrophilic. The molecule also includes a second adhesion group 704 that may be tuned to the other of the material layer 402 or the film-forming liquid and is non-polar and/or hydrophobic. This class of priming material well-suited for use in applications where either the material layer 402 or the film-forming liquid is polar and/or hydrophilic while the other is non-polar and/or hydrophobic. Suitable chemical structures for the polar/hydrophilic adhesion group 702 include hydroxyl groups, amine groups, amide groups, thiol groups, esters, carboxylic acid, anhydride groups, silane, epoxy groups, ketones, cyano groups, isocyano groups, imide groups, and/or other suitable groups. Suitable chemical structures for the non-polar/hydrophobic adhesion group 704 include alkyl groups, phenyl groups, biphenyl groups, benzyl groups, ether groups, cycloalkyl groups, aromatic rings, and/or other suitable groups.

As in the previous examples, the adhesion groups 702 and 704 may be joined by a linking chain 706 of any suitable molecular length and composition such as a substituted or unsubstituted alkyl, a substituted or unsubstituted aryl, a substituted or unsubstituted heteroaryl, a substituted or unsubstituted heterocycloalkyl, and/or other suitable chain. The number of atoms in the linking chain 706 may be selected to control the dispersal, thickness, and longevity of the priming material during the spin coating process.

In addition to one or more of the molecules of FIGS. 5-7, the priming material may include one or more surfactants, solvents, or other additives. One advantage associated with some of the above molecules is that they may be used as a priming material without additional surfactants or solvents. This may eliminate an evaporation step between application of the priming material and the film-forming material.

Figure 8:
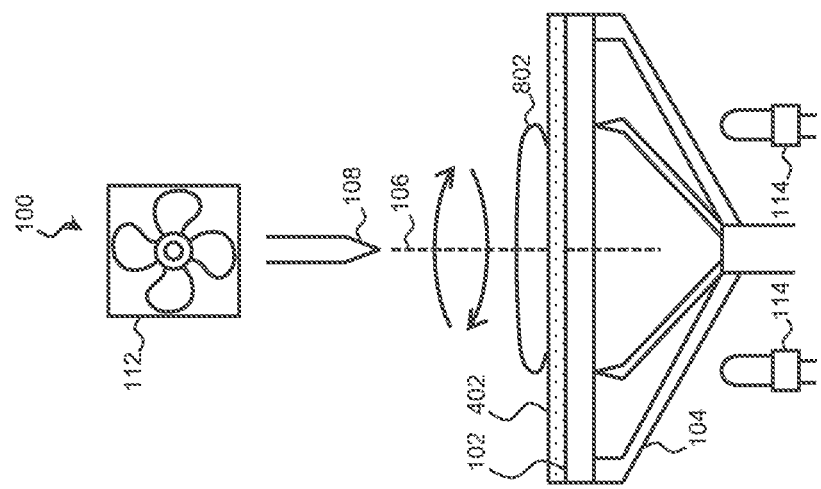

Referring to block 306 of FIG. 3 and to FIG. 8, the selected priming material 802 is dispensed on a central portion of the substrate 102 on top of the layer 402 for which it is configured. In some embodiments, a nozzle 108 is moved from a home position suitable for loading the substrate 102 to a position directly over the center of the substrate 102, and the priming material 802 is dispensed on the substrate 102 through the nozzle 108. The chuck 104 may begin rotating the substrate 102 at any time before, during, and/or after the dispensing of the priming material 802. In an exemplary embodiment, the substrate 102 remains stationary during an initial portion of the dispensing until a first portion of the priming material 802 has been dispensed, and the chuck 104 begins to rotate the substrate 102 after the first portion of the priming material 802 has been dispensed. In the example, the nozzle 108 continues to dispense a remaining portion of the priming material 802 while the substrate 102 spins. Centrifugal tendencies caused by the rotation of the substrate 102 cause the priming material 802 to be drawn from the center to the perimeter of substrate 102.

Dispensing the priming material 802 may include applying heat and/or gasses to the substrate 102 to control dispersal and evaporation of the priming material 802. For example, a nozzle 108 attached to the armature 110 or the downdraft air flow device 112 may provide an inert gas such as nitrogen, helium, or argon on the substrate surface to help distribute the priming material 802. Furthermore, at any time before, during, and/or after the dispensing of the priming material 802, a heating element 114 of the spin coating system 100 may apply heat to the substrate 102 to control primer viscosity, evaporation, and/or other aspects of the spin coating process. These mechanisms and others are used to achieve good coverage of the substrate 102 without overly drying the priming material 802 before the film-forming liquid is applied. Particular attention may be paid to the coverage of the priming material 802 at the substrate perimeter where the priming material 802 may be thinnest.

Figure 9:
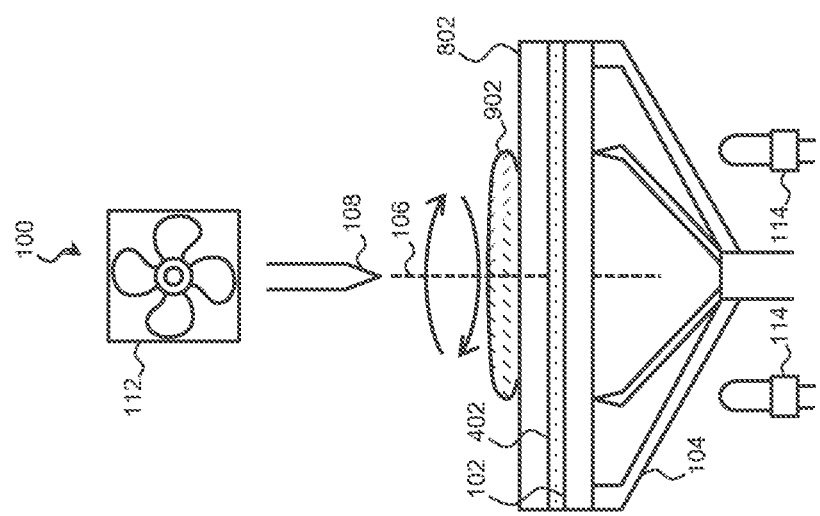

Referring to block 308 of FIG. 3 and to FIG. 9, the film-forming liquid 902 is dispensed on the central portion of the substrate 102. The film-forming liquid 902 may be dispensed by the same nozzle as the priming material 802 or different nozzle 108 may be used. The chuck 104 may rotate the substrate 102 at any time before, during, and/or after the dispensing of the film-forming liquid 902. In an exemplary embodiment, the substrate 102 remains stationary until a first portion of the film-forming liquid 902 has been dispensed, and begins to rotate the substrate 102 while the nozzle 108 continues to dispense a remaining portion of the film-forming liquid 902. The remaining portion may be dispensed while the substrate is rotated. The rotation of the substrate 102 causes the film-forming liquid 902 to be driven from the center to the perimeter of substrate 102.

Similar to the priming material 802, dispensing the film-forming liquid 902 may include applying heat and/or gasses to the substrate 102 to control dispersal and evaporation of the film-forming liquid 902. For example, a nozzle 108 or downdraft air flow device 112 may supply an inert gas such as nitrogen to distribute the film-forming liquid 902 across the substrate 102. Likewise, at any time before, during, and/or after the dispensing of the priming material, a heating element 114 of the spin coating system 100 may apply heat to the substrate 102 to control the evaporation of the film-forming liquid 902. These mechanisms and others are used to achieve good coverage of the substrate 102 particularly at the perimeter where the film-forming liquid 902 may be thinnest.

By using a priming material 802, the film-forming liquid 902 may disperse across the surface of the substrate 102 more evenly. Specifically, a priming material 802 tuned based on the layer 402 being coated and/or the film-forming liquid 902 provides a better interface between the substrate 102 and the film-forming liquid 902 to facilitate even dispersal. As a result, the material remaining after the film-forming liquid 902 dries may have a more consistent thickness with few or no dry spots where the substrate 102 lacks any film material. Moreover, the use of such a priming material 802 may greatly reduce the amount of film-forming liquid 902 used to coat the substrate. In one exemplary test, one cubic centimeter (1 cm$^3$) of a photoresist film-forming liquid 902 applied over a priming material 802 as described herein was used to cover a substrate 102 to a desired thickness without dry spots. In contrast, more than five cubic centimeters (5 cm$^3$) of the same film-forming liquid 902 was needed to produce the same degree of coverage without the priming material. Because the priming material 802 is cheap by comparison, the cost saving per substrate 102 may be substantial. Of course, these advantages are merely exemplary, and no advantage is characteristic of or required for any particular embodiment.

Figure 10:
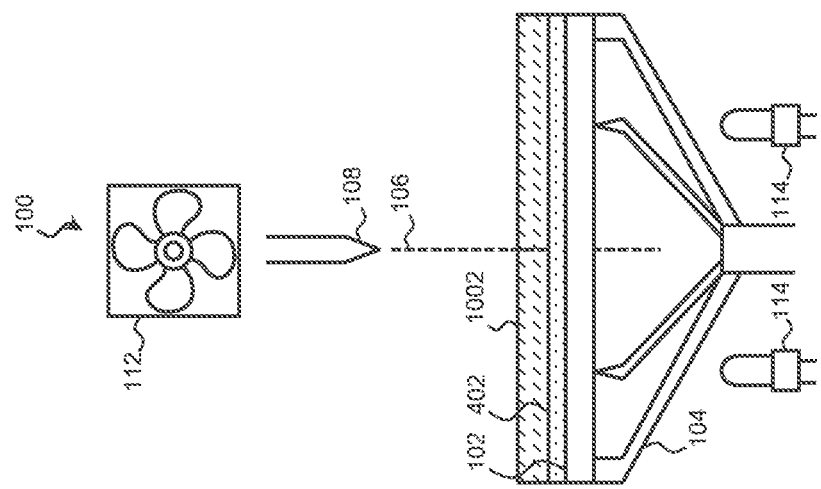

Referring to block 310 of FIG. 3 and to FIG. 10, the film-forming liquid 902 is solidified by evaporating a solvent within the film-forming liquid 902 and evaporating any remaining portion of the priming material 802. Solidification leaves behind a component of the film-forming liquid 902 as a material film 1002 (e.g., a photoresist film, an antireflective coating film, a hard mask film, etc.) of a desired thickness. Evaporation and solidification may occur during the dispersal and spinning processes and block 308 and may continue during a post-spin phase. During the post-spin phase, heat and/or gasses may be applied to the substrate 102 to control evaporation. For example, a gas delivery nozzle 108 or a downdraft air flow device 112 may provide ambient air and/or an inert gas such as nitrogen, helium, or argon on the substrate surface. The supplied gas may be heated to a designated temperature, which may vary throughout the process. Similarly, a heating element 114 of the spin coating system 100 may apply heat to the substrate 102 to control substrate temperature.

Referring to block 312 of FIG. 3 and to FIG. 11, an edge bead removal process may be performed on the film 1002. While the film 1002 tends to be thinner towards the perimeter of the substrate 102, at the extreme edge, surface tension and viscosity of the film-forming liquid 902 may create a bulge or bead 1102 at the edge of the substrate 102. The edge bead may be removed by applying a solvent or an acid to the film 1002 while the substrate 102 is spun. Additionally on in the alternative, a photosensitive film 1002 may undergo an optical bead removal where the bead 1102 is exposed to lithographic energy. Because it has been exposed, the bead 1102 will be removed when the photosensitive film 1002 is developed.

Referring to block 314 of FIG. 3, the substrate 102 containing the film 1002 is provided for further fabrication. In the case of a photoresist film 1002, further fabrication may include a lithographic exposure. An exemplary photolithographic patterning process includes soft baking of the photoresist film 1002, mask aligning, exposure, post-exposure baking, developing the film 1002, rinsing, and drying (e.g., hard baking). In the case of an anti-reflective coating film 1002 or a hard mask film 1002, further fabrication may include any suitable etching process, deposition process, implantation process, epitaxy process, and/or any other fabrication process to be performed on the film 1002. In various examples, the film 1002 is used to fabricate a gate stack, to fabricate an interconnect structure, to form nonplanar devices by etching to expose a fin or by epitaxially growing fin material, and/or other suitable applications. For example, in that regard, the substrate 102 and the film 1002 may be used to fabricate an integrated circuit chip, a system on a chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Thus, the present disclosure provides a spin coating technique and a priming material for forming thin films that offers superior coverage with reduced fluid utilization. In some embodiments, the provided method includes receiving a substrate and identifying a material of the substrate upon which a layer is to be formed. A priming material is dispensed on the material of the substrate, and a film-forming material is applied to the priming material. The priming material includes a molecule containing a first group based on an attribute of the material and a second group based on an attribute of the film-forming material. In some such embodiments, the first group is configured to have a water affinity that corresponds to a water affinity of the material, and the second group is configured to have a water affinity that corresponds to a water affinity of the film-forming material. In some such embodiments, the first group is configured to have a degree of polarity that corresponds to a degree of polarity of the material, and the second group is configured to have a degree of polarity that corresponds to a degree of polarity of the film-forming material. In some such embodiments, the molecule of the priming material further includes a linking structure joining the first group and the second group, where the linking structure includes at least one of: an alkyl structure, an aryl structure, a heteroaryl structure, or a heterocycloalkyl structure.

In further embodiments, the provided method includes receiving a substrate having a material at a top surface of the substrate and selecting a priming material for application using a spin coating technique based on a property of the material of the substrate. The selected priming material is applied to the material of the substrate by a process that includes rotating the substrate to disperse the priming material radially on the substrate. A film-forming material is applied to the priming material by a process that includes rotating the substrate to disperse the film-forming material radially on the substrate. The priming material and the film-forming material are evaporated to leave a component of the film-forming material in a solid form. In some such embodiments, the priming material includes a molecular group configured based on a polarity of the material. In some such embodiments, the priming material includes a molecular group configured based on a water affinity of the material. In some such embodiments, the priming material is selected further based on a property of the film-forming material and has a first molecular group based on the property of the material of the substrate and a second molecular group based on the property of the film-forming material.

In yet further embodiments, a spin coating primer is provided that includes a molecule having a first molecular group associated with a substrate material and a second molecular group associated with a film-forming material to be applied on the spin coating primer. In some such embodiments, one of the first and second molecular groups includes at least one of: a hydroxyl group, an amine group, an amide group, a thiol group, an ester, carboxylic acid, an anhydride group, silane, an epoxy group, a ketone, a cyano group, an isocyano group, or an imide group. In some such embodiments, one of the first and second molecular groups includes at least one of: an alkyl group, a phenyl group, a biphenyl group, a benzyl group, an ether group, a cycloalkyl group, or an aromatic ring. The molecule may further include a linking structure linking the first molecular group and the second molecular group such as an alkyl structure, an aryl structure, a heteroaryl structure, or a heterocycloalkyl structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a semiconductor substrate on a chuck;
prior to dispensing a liquid priming material on a top surface of the semiconductor substrate, heating the semiconductor substrate from a bottom surface of the semiconductor substrate;
dispensing, with a liquid supply nozzle, the liquid priming material on a central portion of the top surface of the semiconductor substrate while continuing to heat the semiconductor substrate from the bottom surface of the semiconductor substrate, wherein the dispensing of the liquid priming material includes rotating the semiconductor substrate during the dispensing of the liquid priming material, wherein the dispensing of the liquid priming material further includes blowing, with a gas supply nozzle adjacent the liquid supply nozzle, an inert gas onto the liquid priming material and varying a temperature of the inert gas during the dispensing of the liquid priming material on the central portion of the top surface of the semiconductor substrate;
prior to drying the liquid priming material, applying a film-forming material to the liquid priming material on the central portion of the top surface of the semiconductor substrate;
rotating the semiconductor substrate to disperse the film-forming material from the central portion of the top surface of the semiconductor substrate; and
after the rotating, evaporating the liquid priming material and the film-forming material to leave a component of the film-forming material that physically contacts the top surface of the semiconductor substrate.

2. The method of claim 1, wherein the liquid priming material facilitates dispersal of the film-forming material from the central portion of the top surface of the semiconductor substrate to a peripheral portion of the top surface of the semiconductor substrate based on the liquid priming material containing a first chemical group and a second chemical group, the first chemical group being based on an attribute of a material of the semiconductor substrate, the second chemical group being based on an attribute of the film-forming material.

3. The method of claim 2, wherein:
a first one of the first chemical group and the second chemical group includes a chemical group selected from the group consisting of a thiol group, an ester, an epoxy group, a ketone, a cyano group, an isocyano group, and combinations thereof; and
a second one of the first chemical group and the second chemical group includes a benzyl group.

4. The method of claim 1, wherein during the dispensing, the liquid priming material descends from the liquid supply nozzle to the top surface of the semiconductor substrate in a path substantially perpendicular to the top surface of the semiconductor substrate.

5. The method of claim 1, further comprising selecting the liquid priming material based on an affinity of the liquid priming material to a material of the semiconductor substrate and an affinity of the liquid priming material to the film-forming material, wherein the affinity of the liquid priming material to the material of the semiconductor substrate is different than the affinity of the film-forming material to the material of the semiconductor substrate.

6. The method of claim 1, further comprising selecting the liquid priming material based on an affinity of the liquid priming material to a material of the semiconductor substrate and the affinity of the liquid priming material to the film-forming material, wherein the liquid priming material has the same affinity, but to a different degree, to the material of the semiconductor substrate as the film-forming material.

7. The method of claim 1, wherein the liquid priming material includes a first chemical component that is one of polar and hydrophilic and a second chemical component that is one of non-polar and hydrophobic, and
wherein the top surface of the semiconductor substrate includes a material layer that is one of polar, non-polar, hydrophilic and hydrophobic, and
wherein the film-forming material is one of polar, non-polar, hydrophilic and hydrophobic.

8. The method of claim 1, wherein the liquid priming material includes a chemical structure having a first adhesion group, a second adhesion group and a carbon-based linking chain such that the first and second adhesion groups are bonded to the carbon-based linking chain, wherein the first adhesion group is polar and hydrophilic and the second adhesion group is non-polar and hydrophobic.

9. A method, comprising:
receiving a substrate on a chuck, the substrate including a photoresist material layer covering a top surface of the substrate;

prior to dispensing a liquid priming material, heating the substrate from a bottom surface of the substrate using a heating element disposed below a bottom surface of the chuck;

dispensing the liquid priming material directly on the photoresist material layer disposed on the top surface of the substrate while continuing to heat the substrate from the bottom surface of the substrate using the heating element, wherein the continuing to heat the substrate from the bottom surface of the substrate using the heating element includes varying a temperature of the heating element to vary a temperature of the substrate during the dispensing of the liquid priming material, wherein the liquid priming material includes a chemical structure having a first adhesion group, a second adhesion group and a carbon-based linking chain such that the first and second adhesion groups are bonded to the carbon-based linking chain, wherein the first adhesion group is polar and hydrophilic and the second adhesion group is non-polar and hydrophobic;

spin coating the liquid priming material onto the substrate while continuing to heat the substrate from the bottom surface of the substrate using the heating element;

applying a film-forming material to the liquid priming material by spin coating the film-forming material onto the liquid priming material while continuing to heat the substrate from the bottom surface of the substrate using the heating element; and evaporating the liquid priming material and the film-forming material to leave a component of the film-forming material that physically contacts the top surface of the substrate.

10. The method of claim 9, wherein the first adhesion group includes a chemical group selected from the group consisting of a hydroxyl group, an amine group, an amide group, a thiol group, an ester, carboxylic acid, an anhydride group, silane, an epoxy group, a ketone, a cyano group, an isocyano group, an imide group, or combinations thereof.

11. The method of claim 9, wherein the second adhesion group includes a chemical group selected from the group consisting of an alkyl group, a phenyl group, a biphenyl group, a benzyl group, an ether group, a cycloalkyl group, an aromatic ring, or combinations thereof.

12. The method of claim 9, further comprising applying heat to the top surface of the substrate after applying the liquid priming material and prior to applying the film-forming material.

13. The method of claim 9, wherein:

during a first phase of the spin coating of the liquid priming material, a central portion of a top surface of the photoresist material layer is covered by the liquid priming material, while a continuous annular region remains free of the liquid priming material; and during a second phase of the spin coating of the liquid priming material, the chuck rotates to radially disperse the liquid priming material on the top surface of the photoresist material layer.

14. The method of claim 9, wherein:

during a first phase of the spin coating of the film-forming material, a central portion of the substrate onto which the film-forming material is applied is covered by the film-forming material, while a continuous annular region remains free of the film-forming material; and during a second phase of the spin coating of the film-forming material, the chuck rotates the substrate to radially disperse the film-forming material on the liquid priming material.

15. The method of claim 9, wherein the chemical structure is 2-heptanone.

16. A method, comprising:

receiving a substrate on a chuck;

identifying a material at a top surface of the substrate;

prior to dispensing a liquid priming material on the top surface of the substrate, applying heat to an underside of the substrate using a plurality of heating elements disposed below the chuck;

dispensing, with a liquid supply nozzle, the liquid priming material on a central portion of the top surface of the substrate while continuing to heat the underside of the substrate using the plurality of heating elements, wherein the continuing to heat the underside of the substrate using the plurality of heating elements includes varying a temperature of the plurality of heating elements to vary a temperature of the substrate during the dispensing of the liquid priming material;

rotating the chuck to spread the liquid priming material evenly across the top surface of the substrate; and after spreading the liquid priming material evenly across the top surface of the substrate, applying a film-forming material to the liquid priming material on the central portion of the top surface of the substrate while continuing to heat the underside of the substrate using the plurality of heating elements.

17. The method of claim 16, wherein the liquid priming material facilitates dispersal of a film-forming material from a central portion of the substrate to a peripheral portion of the substrate, the liquid priming material having a first component with a first water affinity similar to that of the material at the top surface of the substrate, the liquid priming material also having a second component with a second water affinity similar to that of the film-forming material.

18. The method of claim 17, wherein the liquid priming material further includes a molecule having a further first component and a further second component, wherein:

the further first component includes chemical group selected from the group consisting of a hydroxyl group, an amine group, an amide group, a thiol group, an ester, carboxylic acid, an anhydride group, silane, an epoxy group, a ketone, a cyano group, an isocyano group, an imide group, and combinations thereof; and the further second component includes chemical group selected from the group consisting of an alkyl group, a phenyl group, a biphenyl group, a benzyl group, an ether group, a cycloalkyl group, an aromatic ring, and combinations thereof.

19. The method of claim 16, further comprising evaporating the liquid priming material and the film-forming material to leave a component of the film-forming material that physically contacts the top surface of the substrate.

20. The method of claim 16, further comprising blowing an inert gas on the liquid priming material while rotating the chuck to spread the liquid priming material evenly across the top surface of the substrate.

* * * * *